United States Patent [19]

Nishioka et al.

[11] Patent Number: 4,691,078

[45] Date of Patent: Sep. 1, 1987

[54] ALUMINUM CIRCUIT TO BE DISCONNECTED AND METHOD OF CUTTING THE SAME

[75] Inventors: Tadashi Nishioka; Hiroshi Koyama, both of Itami; Yoji Mashiko, Takarazuka, all of Japan

[73] Assignee: Mitsubishi Denki Kabushiki Kaisha, Tokyo, Japan

[21] Appl. No.: 823,091

[22] Filed: Jan. 21, 1986

[30] Foreign Application Priority Data

Mar. 5, 1985 [JP] Japan .................................. 60-45077

[51] Int. Cl.$^4$ .......................... H05K 1/00; B23K 26/00
[52] U.S. Cl. ..................................... 174/68.5; 29/847; 219/121 LG
[58] Field of Search ......................... 174/68.5; 29/847; 219/121 LG, 121 LJ, 121 LN

[56] References Cited

U.S. PATENT DOCUMENTS 4,424,621  1/1984  Abbas et al. .................... 156/657 X

OTHER PUBLICATIONS

Aggarwal, B. K. et al; Laser Cutting Metal Through Quartz; IBM Technical Disclosure Bulletin; vol. 22, No. 5; Oct. 1979; pp. 1971-1972.
Myron J. Rand, "Reliability of LSI Memory Circuits Exposed to Laser Cutting", 17th annual proceedings, Reliability Physics 1979, pp. 220-225.
Robert T. Smith et al., "Laser Programmable Redundancy and Yield Improvement in a 64K Dram", IEEE Journal of Solid-State Circuits, vol. SC-16, No. 5, Oct. 1981, pp. 506-514.

Primary Examiner—Morris H. Nimmo
Attorney, Agent, or Firm—Lowe, Price, Leblanc, Becker & Shur

[57] ABSTRACT

In order to cut a portion of an aluminum interconnection to be disconnected in an aluminum circuit, the aluminum interconnection portion in the region to be cut is covered with a hydrogen-containing silicon nitride film by plasma CVD and is then irradiated with laser beams in an operating sequence consisting of three steps: the first step with relatively low power intensity and long irradiation time duration, the second step with intermediate power intensity and short irradiation time duration and the third step with relatively high power intensity and shortest irradiation time duration.

2 Claims, 13 Drawing Figures

4,691,078

ALUMINUM CIRCUIT TO BE DISCONNECTED AND METHOD OF CUTTING THE SAME

BACKGROUND OF THE INVENTION

1. Field of the Invention

This invention relates to improvements in a construction for an aluminum circuit to be disconnected and a method of cutting the same, wherein, in a semiconductor device, in order to replace defective bits by redundant bits, the corresponding aluminum interconnection portion in the circuit is cut.

2. Description of the Prior Art

In the construction of an aluminum circuit having an interconnection to be disconnected, wherein, in order to replace a faulty bit in a semiconductor memory device the aluminum interconnection portion in the circuit is cut, use has been made of a construction wherein aluminum interconnections are formed on the flat surface of an underlying base formed of an insulating film. In a method of disconnecting aluminum interconnections, use has been made of applying a laser beam to an aluminum interconnection portion to be cut to thereby evaporate the aluminum for cutting.

FIG. 1 is a perspective view showing the construction of a conventional aluminum circuit to be disconnected. In FIG. 1, the conventional circuit to be disconnected 300 has a construction in which an aluminum interconnection 1 to be cut is formed on the flat surface of an underlying base formed of an insulating film 3. The cutting of conventional aluminum interconnections will now be described with reference to FIG. 1.

A predetermined region of the aluminum interconnection 1 to be cut is irradiated with a laser beam 4 from a laser optics (not shown), whereby the aluminum in the irradiated region is evaporated and the aluminum interconnection 1 is cut. The laser beam 4 used for cutting has a relatively high power and a relatively long irradation time duration in order to evaporate a relatively large amount of aluminum.

The construction of the aforesaid conventional circuit having an aluminum interconnection to be disconnected and the method of cutting the same have the following problems.

FIG. 2 is a perspective view for explaining the aforesaid problems, showing scattered aluminum particles produced when an aluminum interconnection is cut. In FIG. 2, there is shown, on an insulating film base 3, an aluminum interconnection 1 which has been cut, and also shown are scattered aluminum particles 9 produced by the cutting of the aluminum interconnection.

Heretofore, a laser beam of relatively high power intensity has been used to ensure that the aluminum in the portion of the aluminum interconnection 1 to be cut evaporates quickly. As a result, the evaporated aluminum is scattered over a wide range around the cut portion and solidifies thereon; thus, there has been a problem that the scattered aluminum particles 9 give rise to defects such as current leaks and short circuits between aluminum interconnections in that region.

For prior art of cutting aluminum interconnections using laser beams, refer to:

(1) Myron J. Rand, "RELIABILITY OF LSI MEMORY CIRCUITS EXPOSED TO LASER CUTTING", 17th annual proceedings, Reliability Physics 1979, pp. 220-225; and
(2) Robert T. Smith et al., "Laser Programmable Redundancy and Yield Improvement in a 64K DRAM", IEEE JOURNAL OF SOLID-STATE CIRCUITS, Vol. SC-16, No. 5, October 1981, pp. 506-514.

The prior art (1) discloses a method in which after an interconnection has been cut by a laser, the region is covered with a plasma silicon nitride film.

The prior art (2) discloses a method in which an interconnection is cut using a laser beam having a power of about 10 µT/pulse and an irradiation time duration of about 50 ns.

SUMMARY OF THE INVENTION

Accordingly, an object of the invention is to provide a construction for a circuit having an aluminun interconnection to be disconnected and a method of cutting the same, which have eliminated the aforesaid disadvantages, wherein aluminum is not scattered when an aluminum interconnection is cut, and hence, there is no possibility of a current leak or a short-circuit taking place between aluminum interconnections.

In brief, this invention comprises using an aluminum circuit to be disconnected of such a construction that an aluminum interconnection portion to be cut is covered in advance with a hydrogen-containing silicon nitride insulating film deposited by plasma CVD, and successively applying laser beams of different power intensities and irradiation time durations to the portion of the aluminum interconnection to be cut through said plasma silicon nitride insulating film, to thereby cut the aluminum interconnection.

Preferably, a step portion is formed in the base insulating film underlying the aluminum interconnection to be cut.

The sequence for irradiation with laser beams consists of three operating steps: One with relatively low power and long irradiation time duration, the second with intermediate power and short irradiation time duration and the third with high power and shortest irradiation time duration.

As is known in the art, a plasma silicon nitride insulating film is formed using a gas system composed of ammonia, monosilane and nitrogen (or argon), and therefore it contains a large amount of hydrogen. It is possible to increase the hydrogen content by changing the flow rate of each of these gases, the pressure of the gas system, and the frequency and power of plasma. When the insulating film of plasma silicon nitrides is heated, the hydrogen is expelled from the insulating film. In a relatively low temperature condition, hydrogen can be easily absorbed by aluminum, but in a high temperature condition the absorbed hydrogen can be easily expelled from the aluminum. Further, aluminum has a Young's modulus lower than that of the plasma silicon nitride insulating film and is plastically deformable with ease. Thus, the aluminum interconnection can be cut by the following action.

First, the region of the plasma silicon nitride insulating film above the portion of the aluminum interconnection to be cut is heated by a relatively low power laser beam to a relatively low temperature to expel hydrogen therefrom into the underlying aluminum portion. The portion of the aluminum interconnection occludes said expelled hydrogen. At this time, the density of the aluminum in the hydrogen-occluding portion lowers, and the increase in volume due to hydrogen occlusion is accommodated by the portion of the aluminum interconnection which is not covered with said plasma silicon nitride insulating film. Subsequently, the same region is heated rapidly for a short time at a relatively high temperature by a laser beam. As a result of this high-speed and high-temperature heating, a large amount of hydrogen is expelled at a high speed from the plasma silicon nitride insulating film, as is the hydrogen occluded in the aluminum. At this time, the density of the aluminum in the hydrogen-occluding portion increases to undergo volumetric contraction. As a result, there is formed a small clearance typically between the underlying insulating film base and the aluminum interconnection. Since the surface free energy on the closed curved surface which defines said small clearance is less than the free energy in other portions than said clearance, these expelled hydrogen molecules (or atoms) are accumulated in said clearance to exert a high pressure on the aluminum in that region, thereby plastically deforming the aluminum to form a cavity. In this connection it is to be noted that both the width and the thickness of the interconnection used in recent semiconductor devices are small. Therefore, the formation of such cavity results in the interconnection being disconnected; thus, the aluminum interconnection can be easily cut. Finally, in consideration of the possibility of aluminum residues present in the cavity, the same region is further heated at a high temperature for a short time so as to cause a small amount of aluminum remaining in the cavity to evaporate within the cavity, whereby the aluminum interconnection is cut reliably.

The aforesaid heating can be effected by irradiation with laser beams. Since both the power intensity and the power output time duration of laser beams can be quickly and easily changed, accurate control of heating temperature and heating time duration is possible.

These object and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

Figure 1:
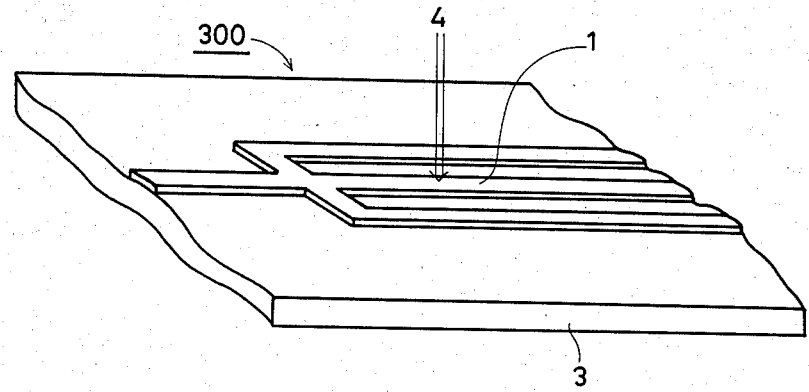
FIG. 1 is a perspective view of a conventional circuit having an aluminum interconnection to be disconnected.
Figure 2:
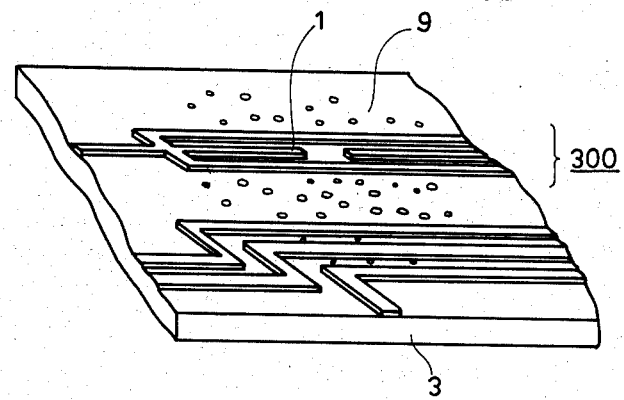
FIG. 2 is a perspective view illustrating problems of the circuit to be disconnected of FIG. 1.
Figure 3:
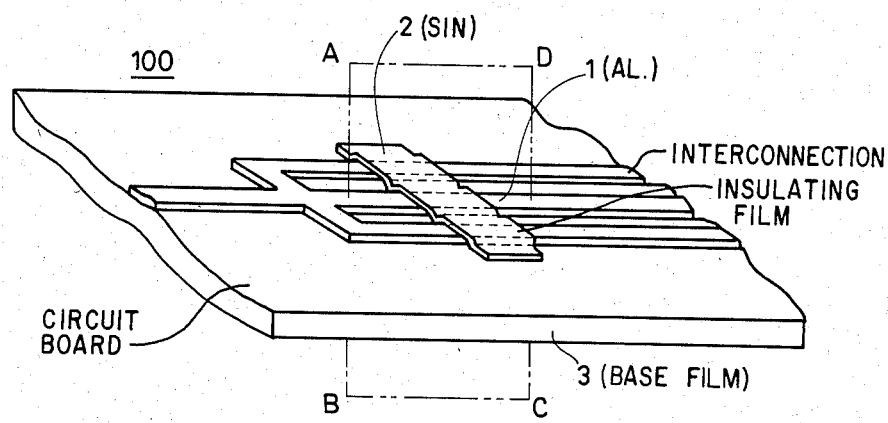
FIG. 3 is a perspective view showing the construction of a circuit having an aluminum interconnection disconnected according to an embodiment of this invention.

FIG. 3 is a perspective view showing the construction of a circuit having an aluminum interconnection to be disconnected according to an embodiment of the invention. In FIG. 3, a circuit to be disconnected 100 comprises an aluminum interconnection 1 to be cut, a hydrogen-containing plasma silicon nitride insulating film 2 formed on the portion of the aluminum interconnection 1 to be cut, and an underlying insulating film base 3 for the aluminum interconnection 1.

Figure 4:
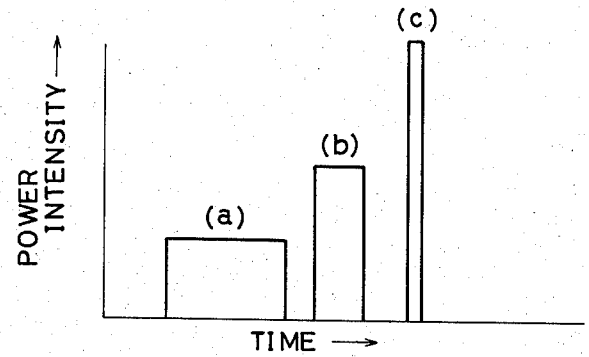
FIG. 4 is a graph showing a sequence for the power intensity and irradiation time duration of laser beams used for cutting the aluminum interconnection.

FIG. 4 is a graph showing a sequence for the power intensity and irradiation time duration of laser beams to be used for cutting the aluminum interconnection of the circuit to be disconnected. As for the laser beams to be used, light from laser source of which energy can be easily absorbed by aluminum, such as a YAG laser with a wavelength of 1.06 μm, is focused into a beam by an optical system.

As shown in FIG. 4, the laser beam irradiation sequence consists of three operating steps: the first step (a) with relatively low power intensity and long irradiation time duration, the second step (b) with relatively higher power intensity and shorter irradiation time duration than in the first step (a), and the third step (c) with higher power intensity and shorter irradiation time duration than in the second step (b).

FIGS. 5A through 5D are sectional views showing how the aluminum interconnection in the embodiment of FIG. 3 is cut, illustrating the main processing steps taking place in the section taken along the ABCD plane in FIG. 3. A method of cutting aluminum interconnections according to an embodiment of the invention will now be described with reference to FIGS. 5A through 5D.

Figure 5A:
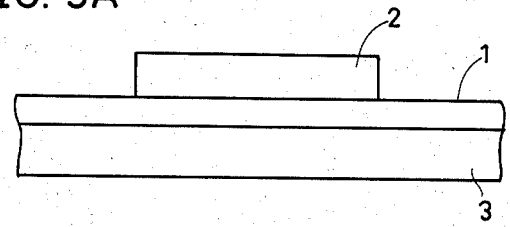
FIGS. 5A–5D are sectional views showing how the aluminum interconnection in the embodiment of FIG. 3 is cut.

FIG. 5A shows a state prior to laser beam irradiation, wherein an aluminum interconnection 1 to be cut is formed on the flat surface of an insulating film base 3, and a hydrogen-containing plasma silicon nitride insulating film 2 is deposited on the portion of the aluminum interconnection to be cut.

Figure 5B:
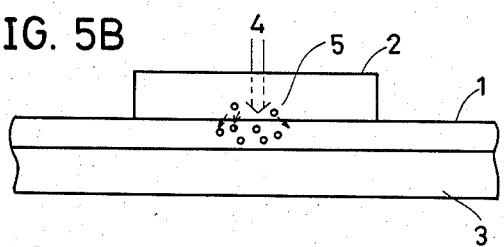

Referring to FIG. 5B, a laser beam 4 with relatively low power intensity and long irradiation time duration at the first step (a) shown in FIG. 4 is applied to the portion of the aluminum interconnection 1 to be cut through the plasma silicon nitride insulating film 2. As a result, the portion of the aluminum interconnection 1 to be cut absorbs the energy of the laser beam 4 and is thereby heated to a relatively low temperature. The heat generated is transferred to the insulating film of plasma silicon nitrides 2 adjacent the heated portion of the aluminum interconnection 1 to be cut. In response thereto, a relatively small amount of hydrogen 5 is expelled from the plasma silicon nitride insulating film 2, said hydrogen 5 being then occluded in the portion of the aluminum interconnection 1 to be cut.

Figure 5C:
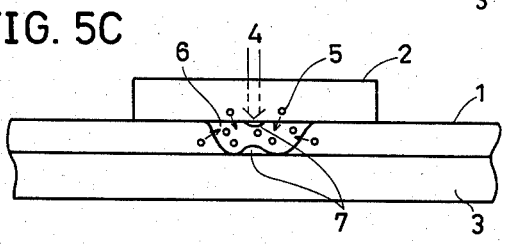

In FIG. 5C, a laser beam 4 with relatively higher power intensity and shorter irradiation time duration at the second step (b) in FIG. 4 than in the first step (a) is applied to the same portion. As a result, the portion of the aluminum interconnection 1 to be cut is heated at high speed to a high temperature, the heat generated causing a large amount of hydrogen 5 to be expelled from the plasma silicon nitride insulating film 2. Concurrently therewith, the hydrogen 5 which has been already occluded in the portion of the aluminum interconnection 1 to be cut is also expelled, so that a small clearance is formed typically at the interface between the insulating film base 3 and the aluminum interconnection 1. Since the molecules (or atoms) of hydrogen 5 tend to concentrate in the clearance, as described previously, they become a mass of gas exerting a high pressure on the aluminum, pressing the portion of the aluminum interconnection 1 to be cut. The aluminum whose Young's modulus is lower than that of the plasma silicon nitride insulating film 2 and which is plastically deformable with ease, is pressed by the internal pressure, so that a cavity 6 containing the hydrogen 5 is formed. As a result of the appearance of this cavity 6, the portion of the aluminum interconnection 1 to be cut is substantially completely cut, but there may be a possibility of a slight amount of aluminum 7 remaining on the plasma silicon nitride insulating film 2 and/or insulating film base 3 in the cavity 6.

Figure 5D:
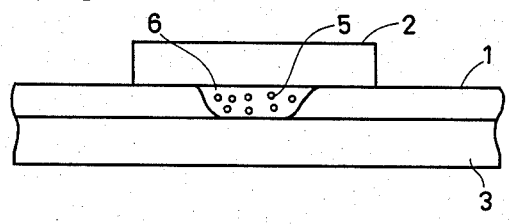

In FIG. 5D, to remove such residual aluminum 7, a laser beam 4 with higher power intensity and shorter irradiation time duration at the third step (c) in FIG. 4 than in the second step (b) is applied to the same portion, thereby completely removing the residual aluminum 7. The residual aluminum 7 is evaporated and is adsorbed by the cut end surfaces of the aluminum interconnection; thus, the aluminum interconnection 1 is completely cut.

In addition, even if hydrogen gas 5 is contained in the cavity 6, this does not matter since hydrogen is electrically highly insulating.

Figure 6:
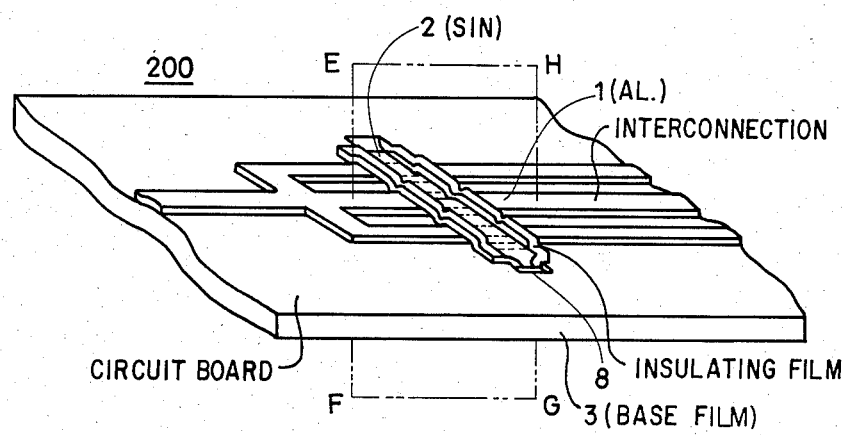
FIG. 6 is a perspective view showing the construction of a circuit having an aluminum interconnection to be disconnected according to another embodiment of the invention.

FIG. 6 is a perspective view showing the construction of a circuit having an aluminum interconnection to be disconnected according to another embodiment of the invention. In FIG. 6, a circuit to be disconnected 200 has a step portion 8 formed in the region of an underlying insulating film base 3 corresponding to the portion of an aluminum interconnection 1 to be cut. The width of the step portion 8 is equal to or less than the width of the aluminum interconnection 1. A laser beam 4 is directed to the region of step portion 8.

FIGS. 7A through 7D sectional views illustrating how the aluminum interconnection 1 in the embodiment of FIG. 6 is cut. FIGS. 7A through 7D are sectional views taken along the EFGH plane in FIG. 6, showing how the aluminum interconnection 1 is cut using laser beams 4 of the same power intensity and irradiation time duration as in FIG. 4 and in the same processing steps as described with reference to FIGS. 5A through 5D. This embodiment of the invention will now be described with reference to FIGS. 6 and 7A through 7D.

Figure 7A:
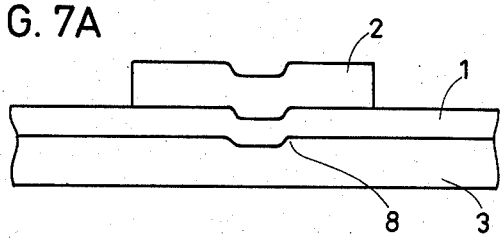
FIGS. 7A–7D are sectional views illustrating how the aluminum interconnection in the embodiment of FIG. 6 is cut.
Figure 7B:
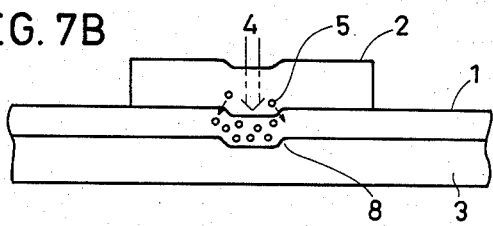
Figure 7C:
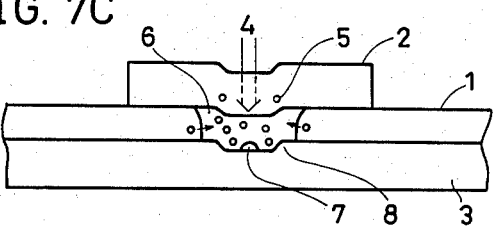
Figure 7D:
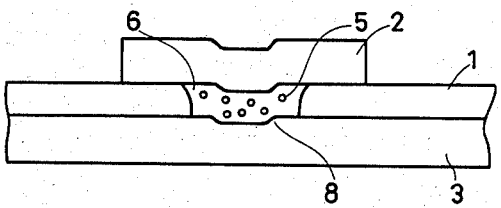

By irradiation with a laser beam 4, the portion of the aluminum interconnection 1 to be cut and also the plasma silicon nitride insulating film 2 are heated and hydrogen is expelled (FIG. 7B). Because of the presence of the step portion 8 at the portion of the aluminum interconnection 1 to be cut, the thermal stress produced in the heated portion of the aluminum interconnection 1 to be cut is greater than that produced when there is no such step portion 8, so that the aluminum adjacent the step portion 8 is subjected to a higher pressure which facilitates plastic deformation of the aluminum and formation of said small clearance. Therefore, the hydrogen 5 easily concentrates in the clearance to reliably form a cavity 6 (FIG. 7C), so that the cutting of aluminum interconnection 1 can be performed substantially without residual aluminum 7 (FIG. 7D).

Though not shown, in the embodiments of FIGS. 3 and 6 it is possible to employ a circuit construction in which a surface protective film is provided on the entire surface of the circuit having an aluminum interconnection to be disconnected. In the conventional arrangement and method, even if a surface protective film is provided, the need of using a very strong laser beam 4 for evaporating aluminum results in the formation of holes in the surface protective film, allowing aluminum vapor to spout therefrom, which, in turn, can cause the aforesaid short-circuit or current leak. In contrast, in the embodiments of the invention, being plastically deformed under the pressure of hydrogen 5 expelled from the plasma silicon nitride insulating film 2, makes it sufficient to use a laser beam of lower power intensity than that of laser beams used in the prior art; thus, there is no possibility of the formation of holes in the surface protective film.

As has so far been described in detail, the temperature-dependent property of the hydrogen-containing silicon nitride insulating film by the plasma CVD, the property of hydrogen to accumulate in an existing small clearance, so as to provide an increased hydrogen gas pressure, the property of the thermal stress of increasing in the vicinity of the step portion formed on the underlying insulating film base, and the property of aluminum of being easily plastically deformed are used to cut the aluminum interconnection; thus, laser beams lower in power intensity than in the prior art can be effectively used. Further, since there is no possibility of the the formation of through holes in plasma silicon nitride insulating film and the surface protective film, there is no possibility of a short-circuit and current leak occurring in other aluminum interconnection regions.

The aforesaid merits are noticeable particularly in a construction where the underlying insulating film base is provided with a step portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit having aluminum interconnections to be disconnected wherein said aluminum interconnections having a portion to be cut are formed on an underlying insulating film base, said circuit to be disconnected comprising:
   a hydrogen-containing plasma silicon nitride film formed to cover at least said portion of said aluminum interconnections to be cut.

2. A circuit having aluminum interconnections to be disconnected as set forth in claim 1, wherein said underlying insulating film base has a step portion in said portion to be cut.

* * * * *